(12) United States Patent
Yamauchi

(10) Patent No.: US 6,972,418 B2
(45) Date of Patent: Dec. 6, 2005

(54) ION DOPING APPARATUS, AND MULTI-APERTURED ELECTRODE FOR THE SAME

(75) Inventor: Tetsuya Yamauchi, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 28 days.

(21) Appl. No.: 10/654,437

(22) Filed: Sep. 4, 2003

(65) Prior Publication Data

US 2004/0195524 A1 Oct. 7, 2004

(30) Foreign Application Priority Data

Sep. 6, 2002 (JP) .............................. 2002-261139

(51) Int. Cl.[7] ............................................ H01J 37/30
(52) U.S. Cl. ............................. 250/492.1; 250/423 R; 315/111.71; 256/423 R
(58) Field of Search ........................ 250/492.1, 423 R; 315/111.71; 256/423 R

(56) References Cited

U.S. PATENT DOCUMENTS

| | | | |
|---|---|---|---|
| 5,023,458 A | * | 6/1991 | Benveniste et al. ..... 250/396 R |
| 5,943,593 A | * | 8/1999 | Noguchi et al. ............ 438/487 |
| 2004/0002202 A1 | * | 1/2004 | Horsky et al. .............. 438/515 |

* cited by examiner

*Primary Examiner*—Nikita Wells
*Assistant Examiner*—Zia R. Hashmi
(74) *Attorney, Agent, or Firm*—Birch, Stewart, Kolasch & Birch, LLP

(57) ABSTRACT

With the object of suppressing dispersion in the dose of ion implantation within a narrow range in a direction orthogonal to the scan direction of a substrate, an ion doping apparatus irradiates the substrate to-be-scanned with ion beams which are drawn out from multi-apertured electrodes (200 in FIG. 2) each being provided with a large number of electrode apertures (210). In electrode aperture groups $\alpha, \ldots$ of the multi-apertured electrode (200), each including a plurality of electrode apertures (210), the individual electrode apertures (210) are arranged having positional shifts in the direction Y orthogonal to the scan direction X of the substrate so as to homogenize the doses of ion beam implantations into the substrate by the electrode aperture groups $\alpha, \ldots$.

8 Claims, 4 Drawing Sheets

ION DOPING APPARATUS, AND MULTI-APERTURED ELECTRODE FOR THE SAME

BACKGROUND OF THE INVENTION

1. Field of the Invention

The present invention relates to ion doping apparatuses which are employed in manufacturing a low-temperature polysilicon liquid crystal panel, etc., and more particularly to an ion doping apparatus which performs ion doping by scanning a substrate of large area.

2. Background Art

In forming TFTs (thin film transistor) on a large-sized substrate of a low-temperature polysilicon crystal or the like, an ion doping apparatus is employed for the implantations of impurities intended to form the source electrode, drain electrode and LDD regions of the TFTs and to control the threshold voltages of the TFTs.

In a case where the size of the substrate to be doped with ions is, at most, 500 mm-square, the substrate is irradiated with an ion beam whose area is larger than the size of the substrate, thereby to be collectively subjected to the ion doping. On this occasion, there has been proposed a method wherein the substrate is rotated in order to endow the implantation of the ions with a homogeneity.

Besides, as a conventional ion beam homogenization means, there has been one wherein a substrate to be irradiated is swung vertically, laterally or obliquely as stated in JP-A-8-227685.

In order to perform ion doping for a substrate which is larger than 500 mm-square, the above method or means has the problem that an ion source enlarges because the area of an ion beam needs to be made larger than the size of the substrate, so the whole apparatus becomes large in size.

In the case of the ion doping of the large substrate, therefore, the substrate is generally irradiated with a rectangular ion beam which is easily formed to be comparatively homogeneous, and it is scanned, whereby homogeneous ion doping is effected.

In projecting such a rectangular ion beam, there is also a method which employs an electrode that is provided with a slit-like drawing-out port in order to draw out the ion beam. Since, however, the convergence of the ion beam differs between at the central part and end parts of the slit, it is difficult to secure the homogeneity of the ion beam in the lengthwise direction of the slit. The difficulty is coped with by adopting a method which employs a multi-apertured electrode that is formed with a plurality of circular electrode apertures as shown in FIG. 5.

The multi-apertured electrode 200 shown in FIG. 5 is so laid out that the large number of circular electrode apertures 210 form an array at a predetermined pitch b in parallel with the scan direction X of the substrate (in the ensuing description, sometimes called "vertical direction"), and that a plurality of such arrays are arranged in a direction Y (in the ensuing description, sometimes called "lateral direction") orthogonal to the scan direction. Here, the electrode apertures 210 of each array are shifted from those of the adjacent array by half c of the pitch b. Besides, the arrays themselves of the electrode apertures 210 are arranged at a predetermined pitch a. More specifically, the electrode apertures 210 each having a diameter d of 5 mm are arrayed at a pitch of 10 mm (b) in the vertical direction, and the arrays are formed at a pitch of 5 mm (a) in the lateral direction. Besides, the electrode apertures 210 of the adjacent arrays are shifted by 5 mm (c) in the vertical direction.

The multi-apertured electrode 200 including the circular electrode apertures 210 as stated above has the merit that, since the shape of a beam drawn out from each circular electrode aperture 210 becomes circular, the homogeneity of the density of beams over the whole plane of the substrate is easily secured by juxtaposing the circular electrode apertures 210.

Since, however, the circular beams are overlapped one another, dispersion appears within a narrow range in the lateral direction Y, depending upon the convergent states of the beams drawn out from the individual electrode apertures 210. That is, in the layout of the electrode apertures 210 shown in FIG. 5, each array of the electrode apertures 210 extends in parallel with the scan direction X, so that the dose of ion implantation becomes large at the part of the array and small at the interspace between the adjacent arrays. This poses the problem that the cyclic dispersion of the ion implantation dose arises in the lateral direction Y.

SUMMARY OF THE INVENTION

The present invention has been made in view of the above problems, and has for its object to suppress the dispersion of the dose of ion implantation in a narrow range.

An ion doping apparatus according to the present invention for accomplishing the object is characterized by comprising a multi-apertured electrode provided with a large number of apertures, and disposed so as to irradiate a substrate with ion beams drawn out from the electrode while scanning the ion beam; said electrode including at least one electrode aperture group which includes a plurality of electrode apertures, and individual electrode apertures of which are arranged having positional shifts in a direction orthogonal to a scan direction of the substrate.

In accordance with the ion doping apparatus constructed as stated above, the ion beams are drawn out from the electrode apertures, and the substrate to be scanned is irradiated with the ion beams. On this occasion, since the electrode apertures are provided having the positional shifts, the density of the ion beams is homogenized in the direction ("orthogonal direction") orthogonal to the scan direction of the substrate, and dispersion in the dose of ion implantation can be suppressed even in a narrow range.

By the way, in the present invention, only one "electrode aperture group" can be included, that is, all the electrode apertures of the multi-apertured electrode can constitute one electrode aperture group. Alternatively, the electrode apertures of the multi-apertured electrode can be sorted into a plurality of electrode aperture groups in accordance with the densities of the beams of the individual electrode apertures.

More specifically, the densities of the beams of the individual electrode apertures are not constant. By way of example, a density difference of about 80% sometimes arises between at a central part and each end part in the scan direction of the substrate. In such a case, when the electrode apertures are generally formed into one electrode aperture group and are arranged having mean positional shifts, some difference in the doses of ion implantation arises between at the part based on the electrode apertures of high beam density and the part based on the electrode apertures of low beam density. Therefore, the electrode apertures at the central part in the scan direction of the substrate and those at each end part, for example, are sorted into different electrode aperture groups, and the individual electrode apertures have their positions shifted in each of the electrode aperture groups, whereby dispersion in the dose of ion implantation can be suppressed more.

By the way, in the case where the plurality of electrode aperture groups are disposed in this manner, the electrode apertures constituting one of the electrode aperture groups should preferably be arranged at the interstitial positions between the electrode apertures of another electrode aperture group in the orthogonal direction. As a specific example, in a case where the electrode apertures of the central electrode aperture group in the scan direction are arranged so as to shift at a predetermined pitch in the orthogonal direction, the electrode apertures of the electrode aperture group at each end part should preferably be arranged within the pitch in the orthogonal direction. That is, since the dose of ion implantation based on the electrode aperture group of high beam density becomes different between at parts where the electrode apertures exist and interstitial parts where the electrode apertures do not exist, the ion implantation based on the electrode apertures of the other electrode aperture group can be performed at the interstitial parts where the electrode apertures do not exist, and the dose of ion implantation can be homogenized more.

Besides, in the present invention, various layouts can be considered for arranging the electrode apertures with the "positional shifts". By way of example, the "positional shifts" can be attained in such a way that all the electrode apertures constituting the electrode aperture group are arranged so as to respectively differ in their positions in the orthogonal direction.

Besides, in the case of regularly arranging the electrode apertures, it is possible to adopt a layout in which the electrode apertures constituting the electrode aperture group are arranged so as to form arrays in the scan direction of the substrate, and in which the arrays of the electrode apertures have a tilt relative to the scan direction of the substrate. Incidentally, the layout is applicable to both the case where the plurality of electrode aperture groups are disposed in the scan direction, and the case where the single electrode aperture is disposed.

When each array of the electrode apertures is arranged having the tilt relative to the scan direction of the substrate, in this manner, the dose of ion implantation by all the electrode apertures constituting the array is caused to diverge in the orthogonal direction. Incidentally, the electrode aperture at one end part among the electrode apertures constituting a certain array should preferably be arranged so that its distance in the orthogonal direction from the electrode aperture at the other end part among the electrode apertures constituting the adjacent array may become substantially equal to its distance in the orthogonal direction from the electrode aperture of the identical array adjacent on the other end side. More specifically, in a case, for example, where the electrode apertures constituting each array form the array at a predetermined pitch b in a row forming direction, where the electrode aperture at one end part and the electrode aperture at the other end part among the electrode apertures forming the array has an interval B therebetween, and where the arrays of the electrode apertures are arranged at a predetermined pitch a in a direction orthogonal to the array forming direction, the arrays should preferably be disposed so as to have the tilt relative to the scan direction at an angle of $\arctan(a/(B+b))$.

Besides, in the present invention, the multi-apertured electrode should preferably be laid out so that the large number of electrode apertures may form an ion beam of rectangular shape as a whole. In the case where, in this manner, the multi-apertured electrode is laid out so as to form the rectangular ion beam, one pair of parallel latera of the rectangular shape of the ion beam should preferably extend in the scan direction. Thus, unnecessary parts can be prevented from being irradiated with the ion beam, thereby to realize an efficient ion doping process. More specifically, the ion doping apparatus according to the present invention can also be constructed in such a way that the multi-apertured electrode of the related-art example as shown in FIG. 5 is mounted so as to tilt relative to the scan direction, but it has the disadvantage that the size of an ion source itself becomes large. It is therefore preferable to employ the multi-apertured electrode in which the electrode apertures are formed having the positional shifts and are arranged so as to form an ion beam of rectangular shape as a whole, whereby the above disadvantage can be eliminated.

Meanwhile, a multi-apertured electrode for an ion doping apparatus according to the present invention is characterized by comprising a large number of electrode apertures which serve to draw out an ion beam of rectangular shape, as a whole; a plurality of electrode apertures constituting at least one electrode aperture group, and being individually arranged with positional shifts in a direction of one pair of parallel latera of the rectangular shape.

With such a multi-apertured electrode, a substrate is scanned in the direction of the other pair of parallel latera of the rectangular shape of the ion beam, whereby the same advantage as that of the ion doping apparatus according to the present invention as stated above can be brought forth, and an efficient ion doping process is realized.

Incidentally, as in the ion doping apparatus according to the present invention as already stated, the multi-apertured electrode according to the present invention should preferably be so laid out that the individual electrode apertures are sorted into a plurality of electrode aperture groups in accordance with their densities of beams. It is also preferable that the electrode apertures constituting the electrode aperture group are arranged so as to form arrays in the direction of the other pair of parallel latera of the rectangular shape, and that the arrays of the electrode apertures are disposed so as to have a tilt relative to the direction of the other pair of parallel latera of the rectangular shape.

Thus, it is possible to bring forth the same advantages as those of the already-stated ion doping apparatus in which the electrode apertures are sorted into the plurality of electrode aperture groups in accordance with the density distribution of the beams of the individual electrode apertures, or the already-stated ion doping apparatus in which the electrode apertures constituting each electrode aperture group are arranged so as to form the arrays in the scan direction of the substrate and in which the arrays of the electrode apertures are disposed so as to have the tilt relative to the scan direction of the substrate.

DESCRIPTION OF THE PREFERRED EMBODIMENTS

Figure 1:
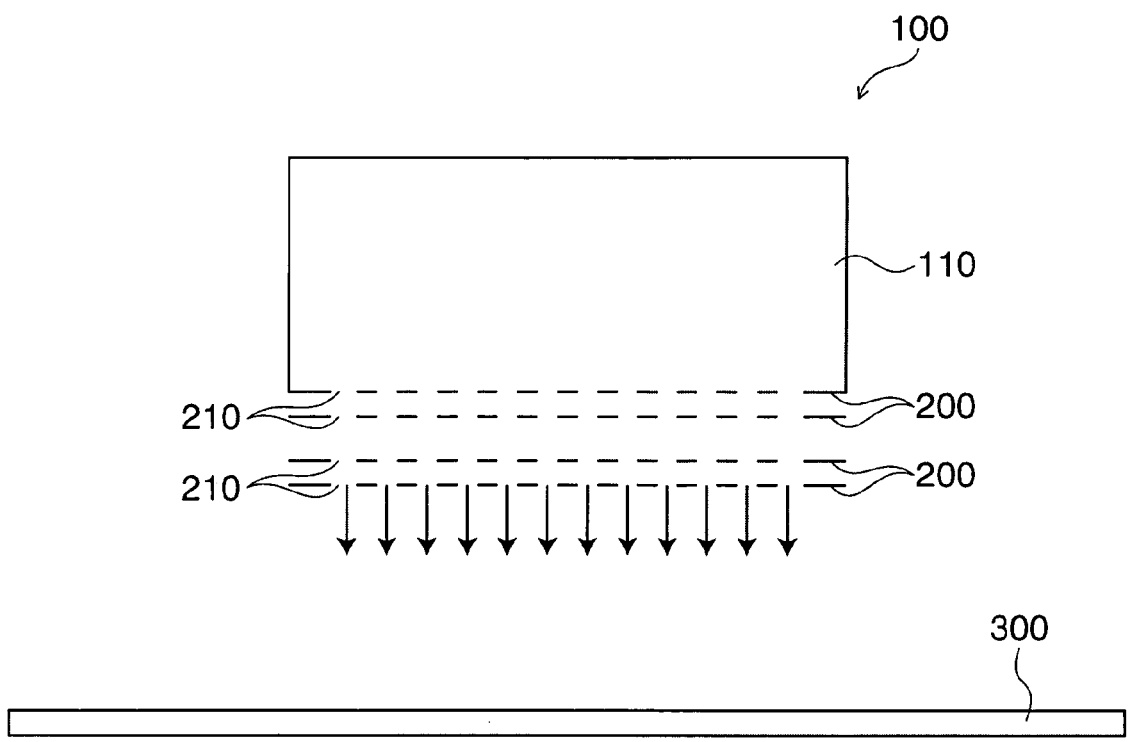
FIG. 1 is a schematic sectional view for explaining the whole construction of an ion doping apparatus in an embodiment of the present invention.

Now, embodiments of the present invention will be described with reference to FIGS. 1 through 4. First, the whole construction of an ion doping apparatus embodying the present invention will be described with reference to FIG. 1.

The ion doping apparatus 100 in this embodiment is so constructed that ions are drawn out from a plasma generation chamber 110 and are accelerated by employing four multi-apertured electrodes 200, and a substrate 300 to be scanned is irradiated with the resulting ion beams. Here, the individual multi-apertured electrodes 200 are formed with large numbers of electrode apertures 210 at the same parts, and the electrode apertures 210 are provided so as to form a rectangular ion beam as a whole.

<First Embodiment>

Figure 2:
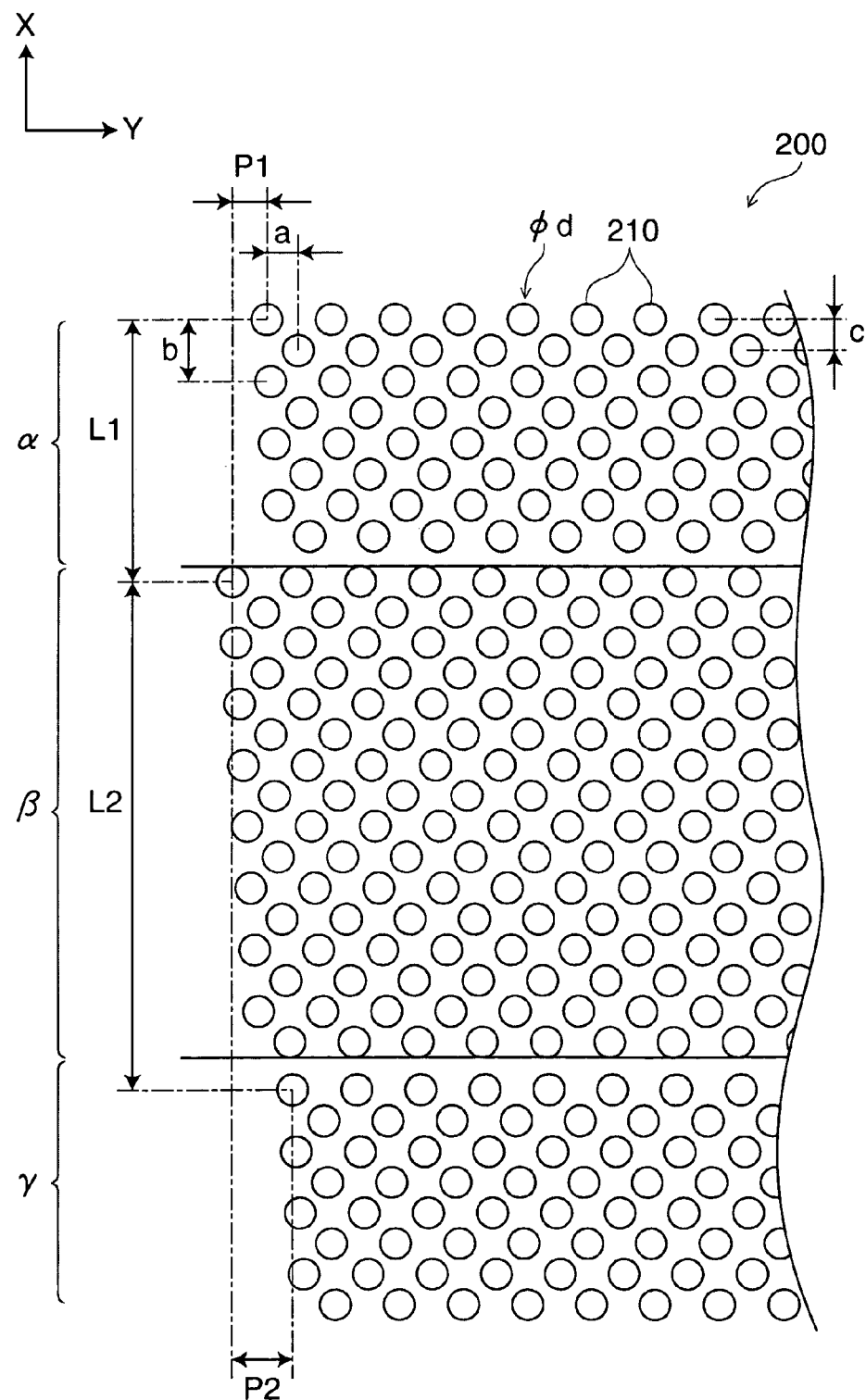
FIG. 2 is a schematic plan view for explaining the layout of the first embodiment of a multi-apertured electrode in the present invention.

Next, the first embodiment of a multi-apertured electrode 200 for use in the ion beam doping apparatus 100 stated above will be described with reference to FIG. 2. By the way, in FIG. 2, the multi-apertured electrode 200 is partially broken away in a direction Y orthogonal to a scan direction X.

The multi-apertured electrode 200 of the first embodiment is so laid out that a large number of electrode apertures 210 are sorted into a plurality of electrode aperture groups α, β and γ in the scan direction X, and that the electrode apertures 210 of one electrode aperture group differ in arrangement from those 210 of another electrode aperture group in the direction Y orthogonal to the scan direction X. Specifically, the large number of electrode apertures 210 are sorted into the three electrode aperture groups; the electrode aperture group β at a central part in the scan direction X, and the electrode aperture groups α and γ at both end parts. That is, in this embodiment, the electrode apertures 210 are sorted into the plurality of electrode aperture groups α, β and γ in accordance with the density of the beams of these electrode apertures 210. The reason for the sorting is that the density of the beams differs about 80% between in the electrode apertures 210 at the central part in the scan direction X of a substrate 300 and the electrode apertures 210 at each end part. Incidentally, although the sorting into the three groups is exemplified in this embodiment, the layout can be appropriately designed and altered so as to sort the electrode apertures 210 into more groups.

Besides, each of the electrode apertures 210 is circular and has a diameter d of 5 mm.

Besides, the electrode apertures 210 in each of the electrode aperture groups α, β and γ are arrayed at a predetermined pitch b in the scan direction X (incidentally, the arrays have a tilt relative to the scan direction X as will be stated later). Moreover, the arrays of the electrode apertures 210 in each of the electrode aperture groups α, β and γ are arranged at a predetermined pitch a in the orthogonal direction Y. Here, the predetermined pitch a is 5 mm, while the predetermined pitch b is 10 mm.

Besides, the electrode apertures 210 of each array are shifted from those of the directly adjacent array by half c (5 mm) of the pitch b in the scan direction X, and the electrode apertures 210 of the second adjacent arrays are located at the same positions in the scan direction X. Further, the adjacent arrays of the electrode apertures 210 are arranged at the predetermined pitch a (5 mm) in the orthogonal direction Y. Incidentally, although the number of the arrays can be appropriately designed and altered, it can be set at 28 by way of example.

The arrangement of the electrode apertures 210 will be explained in detail. The central electrode aperture group β is such that the electrode apertures 210 numbering eight form one array, and that the individual electrode apertures 210 are formed at positions which are successively shifted from those of the adjacent electrode apertures 210 of the identical array by 0.625 mm in the orthogonal direction Y. In other words, the electrode apertures 210 of the identical array are shifted in the orthogonal direction Y in correspondence with (the pitch a of the arrays of the electrode apertures 210)/(the number (eight) of the electrode apertures 210 of one array). Therefore, the direction in which each array is formed comes to have a tilt relative to the scan direction X.

In this manner, in the central electrode aperture group β, the respective electrode apertures 210 are arranged having the positional shifts in the orthogonal direction Y on the substrate 300, so as to homogenize the dose of ion implantation by the electrode aperture group β into the substrate 300.

Besides, in each of the electrode aperture groups α and γ at both the end parts, the electrode apertures 210 numbering four form one array. The electrode aperture group α at one end part is such that the electrode apertures 210 on one end side are formed at positions which are L1 (45 mm) nearer to one end side in the scan direction X, than the electrode apertures 210 on one end side in the central electrode aperture group β, and that the plurality of electrode apertures 210 are arrayed at the predetermined pitch b in the scan direction X as stated above. Besides, the electrode aperture group γ at the other end part is such that the electrode apertures 210 on one end side are formed at positions which are L2 (85 mm) nearer to the other end side in the scan direction X, than the electrode apertures 210 on one end side in the central electrode aperture group β, and that the plurality of electrode apertures 210 are arrayed at the predetermined pitch b in the scan direction X as stated above.

Besides, the electrode aperture group α at one end part is formed so as to generally shift by a predetermined distance P1 in the orthogonal direction Y as compared with the central electrode aperture group β. Specifically, the electrode apertures 210 on one end side in the electrode aperture group α at one end part are formed at positions which are 5 mm nearer to the right side of FIG. 1, than the electrode apertures 210 on one end side in the central electrode aperture group β. Besides, the electrode aperture group γ at the other end part is formed so as to generally shift by a predetermined distance P2 in the orthogonal direction Y as compared with the central electrode aperture group β. Specifically, the electrode apertures 210 on one end side in the electrode aperture group γ at the other end part are formed at positions which are 10 mm nearer to the right side of FIG. 1, than the electrode apertures 210 on one end side in the central electrode aperture group β. That is, the electrode aperture group γ at the other end part is formed so as to be generally nearer to one side (right side) in the orthogonal direction Y by a predetermined distance (P2−P1), than the electrode aperture group α at one end part.

Here, the distance P1 is set at the pitch a of the electrode apertures 210 in the orthogonal direction Y, while the distance P2 is set at double the pitch a. It is also possible, however, to set the distance P1 at a/16 and the distance P2 at 9a/16 by way of example. Thus, the electrode apertures 210 are arranged so that the electrode apertures 210 of the electrode aperture groups α and γ at both the end parts may lie at the intermediate positions of the interstices of the electrode apertures 210 of the central electrode aperture group β in the orthogonal direction Y.

Besides, the individual electrode apertures 210 in the electrode aperture group α at one end part are formed at positions which are successively shifted from those of the adjacent electrode apertures 210 of the identical array by 0.625 mm in the orthogonal direction Y. Likewise, the individual electrode apertures 210 in the electrode aperture group γ at the end part are formed at positions which are successively shifted from those of the adjacent electrode apertures 210 of the identical array by 0.625 mm in the orthogonal direction Y. In other words, in the electrode aperture groups α and γ at both the end parts, the electrode apertures 210 forming the identical arrays are shifted in the orthogonal direction Y in correspondence with (the pitch a of the arrays of the electrode apertures 210)/(the total number (eight) of the electrode apertures 210 of the identical arrays in the electrode aperture groups α and γ at both the end parts). Therefore, the directions in which the arrays are formed in the electrode aperture groups α and γ at both the end parts come to have a tilt relative to the scan direction X.

In this manner, in the electrode aperture groups α and γ at both the end parts, the respective electrode apertures 210 are arranged having the positional shifts in the direction Y orthogonal to the scan direction X on the substrate 300, so as to homogenize the doses of ion implantation by the electrode aperture groups α and γ into the substrate 300.

<Second Embodiment>

Next, the second embodiment of a multi-apertured electrode 200 for the ion doping apparatus 100 will be described with reference to FIG. 3. By the way, in the second embodiment, constituents having the same constructions or functions as in the first embodiment shall be omitted from detailed description.

Figure 5:
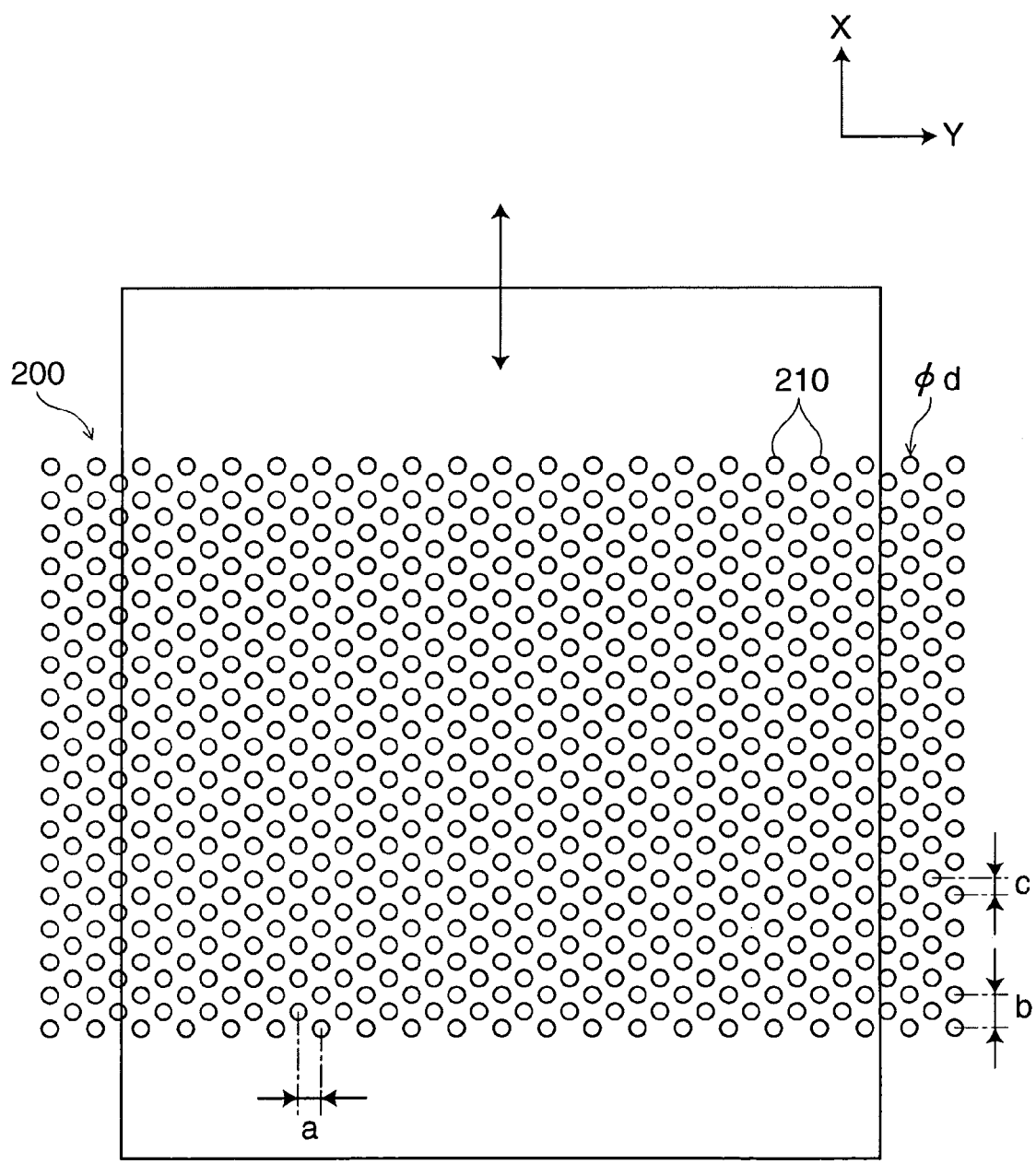
FIG. 5 is a schematic plan view for explaining the related-art example.

In the multi-apertured electrode 200 of the second embodiment, a large number of electrode apertures 210 are regarded as a single electrode aperture group, and all the electrode apertures 210 are provided so as to differ from the other electrode apertures 210 in their arrangement in a direction Y orthogonal to a scan direction X. Specifically, the large number of electrode apertures 210 have the same layout as a state where the multi-apertured electrode 200 shown in FIG. 5 is mounted with a tilt in the scan direction X. Incidentally, although the layout of the second embodiment can be obtained by tilting and mounting the multi-apertured electrode 200 in FIG. 5, it can also be obtained by forming the electrode apertures 210 of the same layout as shown in FIG. 3.

Figure 3:
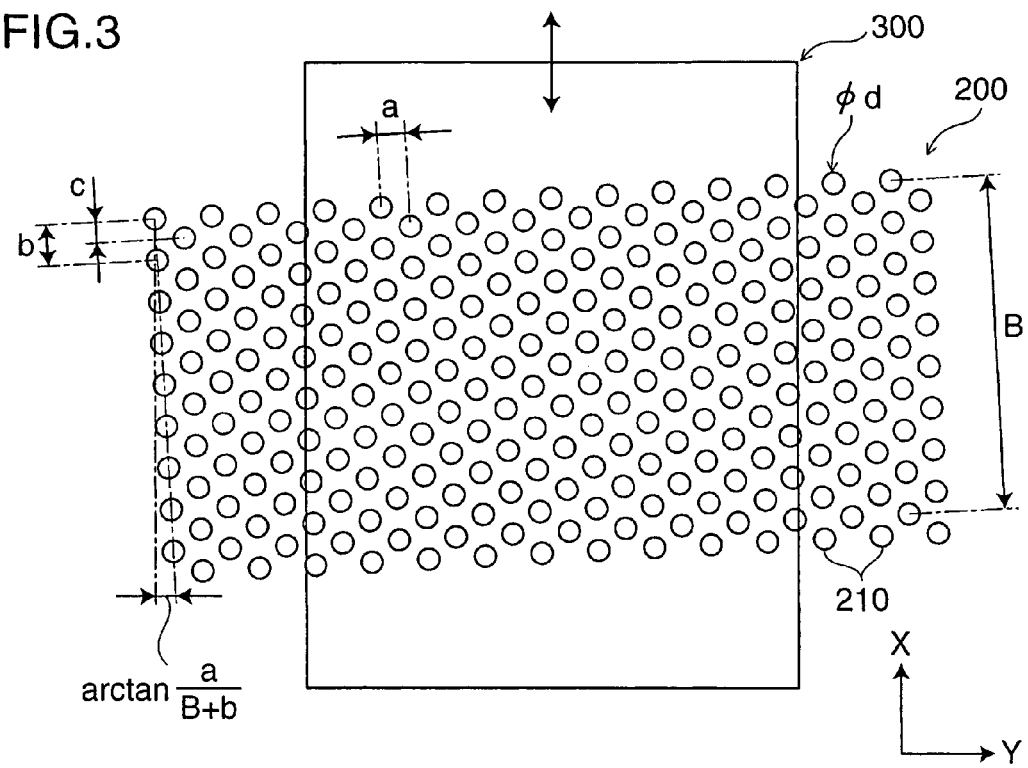
FIG. 3 is a schematic plan view for explaining the layout of the second embodiment of a multi-apertured electrode in the present invention.

Referring to FIG. 3, the plurality of electrode apertures 210 form each array at a predetermined pitch b (10 mm) in an array forming direction which has a predetermined tilt relative to the scan direction X, and a plurality of such arrays are arranged at a predetermined pitch a (5 mm) in a direction which is orthogonal to the array forming direction. Besides, the electrode apertures 210 of each array are shifted from those of the directly adjacent array by half c (5 mm) of the pitch b in the array forming direction, and the electrode apertures 210 of the second adjacent arrays are located at the same positions in the array forming direction.

Regarding the tilt between the array forming direction and the scan direction X, when letter B is let to denote the distance between the electrode apertures 210 located at both the ends of the identical array, the electrode apertures 210 are provided so that the array may be tilted relative to the scan direction X at an angle of arctan (a/(B+b)). More specifically, the angle becomes arctan(5/90)=3.18 degrees by way of example. It has been experimentally verified that, even when the angle is discrepant to the extend of 0.1 degree, the dose of ion implantation does not exhibit a great dispersion. Owing to the above layout, all the electrode apertures 210 are provided so as to differ in their arrangement in the orthogonal direction Y.

<Comparisons>

Figure 4:
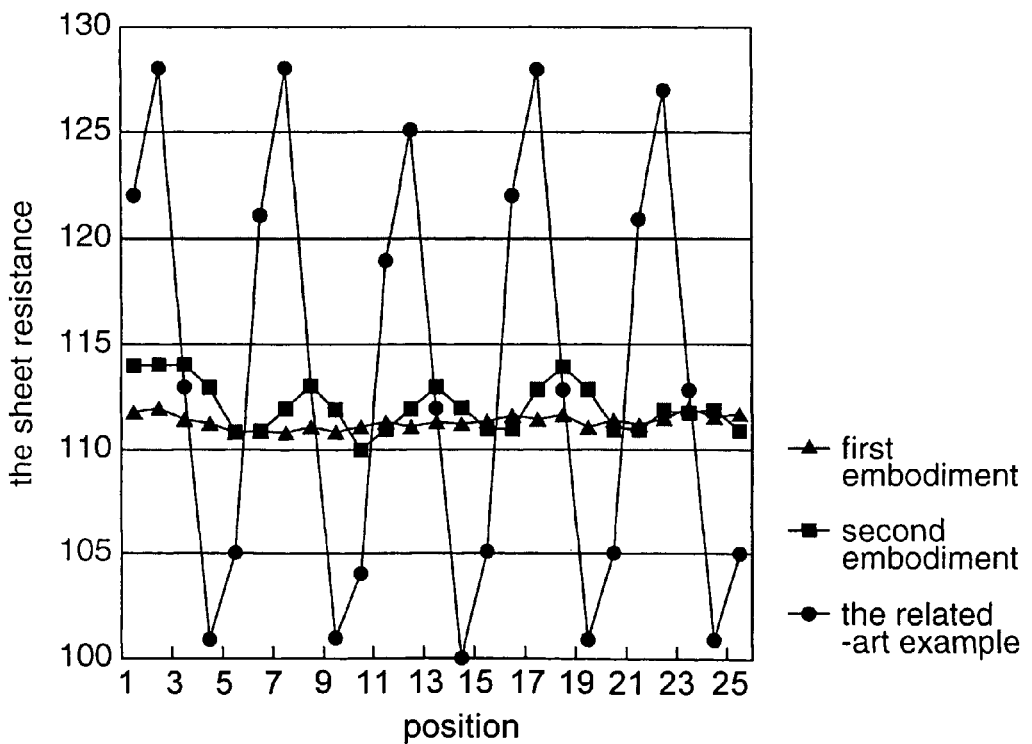
FIG. 4 is a graph showing experimental results for ascertaining the homogeneities of ion implantation doses which are based on the multi-apertured electrodes of the respective embodiments and a related-art example.

Next, FIG. 4 shows the results of an experiment for ascertaining the homogeneities of ion implantation doses based on the multi-apertured electrodes 200 of the first embodiment, second embodiment and related-art example (FIG. 5). The experiment was conducted in such a way that silicon wafers were doped with ions by employing the respective multi-apertured electrodes 200 and setting a drawing-out voltage at 2 kV somewhat higher than an ordinary magnitude, and that, after the silicon wafers were annealed at 950° C. for 30 minutes, the sheet resistance of each of the silicon wafers was measured in an interval of 25 mm at a pitch of 1 mm in the orthogonal direction Y. The cyclic dispersion of the sheet resistance in the section of 25 mm was 0.9% or less in the case of the first embodiment, it was 3.1% or less in the case of the second embodiment, and it was 26.6% in the case of the related-art example.

<Other Embodiments>

Incidentally, the present invention is not restricted to the practicable constructions of the foregoing embodiments, but the ion doping apparatus and the multi-apertured electrode can be appropriately designed and altered within a scope intended by the present invention.

More specifically, although the large number of electrode apertures 210 are regularly arranged in each of the embodiments, the present invention is not always restricted to such an arrangement. Insofar as individual electrode apertures 210 are arranged having positional shifts in a direction Y orthogonal to the scan direction X of a substrate 300 so as to homogenize the dose of ion implantation into the substrate 300 by an electrode aperture group, a multi-apertured electrode falls within the scope intended by the present invention.

Specifically, there has been described the multi-apertured electrode in which the plurality of electrode apertures 210 are arranged at the same pitch in the scan direction X or the array forming direction, thereby to form each array, and in which such arrays are arranged at the same pitch in the orthogonal direction Y. However, the arrangement itself need not have regularity, but it may well be random. By way of example, insofar as individual electrode apertures 210 have their positions shifted so as to homogenize the dose of ion beam implantation into a substrate 300 by electrode aperture groups sorted in accordance with the density of beams, a multi-apertured electrode falls within the scope intended by the present invention. Besides, even in the case where the arrays are formed as in each of the embodiments, the numbers of electrode apertures in the individual arrays need not always be equal. By way of example, it is an appropriately designable and alterable matter that, in the first embodiment, an array consisting of two electrode apertures 210 is formed on the left side of the electrode aperture 210 located on the other end side in the electrode aperture group γ at the other end part.

Besides, the ion doping apparatus 100 according to the present invention is not restricted to the apparatus which includes the multi-apertured electrodes 200 numbering four, but also an apparatus which includes the multi-apertured electrodes 200 numbering, for example, three falls within the scope intended by the present invention.

What is claimed is:

1. An ion doping apparatus, comprising:
a multi-apertured electrode provided with a large number of apertures, and disposed so as to irradiate a substrate with ion beams drawn out from the electrode while scanning the ion beams;
said electrode including at least one electrode aperture group which includes a plurality of electrode apertures, and individual electrode apertures of which are arranged having positional shifts in a direction orthogonal to a scan direction of the substrate.

2. The ion doping apparatus as defined in claim 1, wherein said large number of electrode apertures are sorted into a plurality of electrode aperture groups in accordance with densities of the beams of the individual electrode apertures.

3. The ion doping apparatus as defined in either of claim 1 or 2, wherein the electrode apertures constituting said each electrode aperture group are arranged so as to form arrays in the scan direction of the substrate, and the arrays of the electrode apertures are disposed so as to have a tilt relative to the scan direction of the substrate.

4. An ion doping apparatus, comprising:
a multi-apertured electrode provided with a large number of apertures, said apertures being disposed so as to irradiate a substrate with ion beams drawn out from the electrode while scanning ion beams;
the electrode apertures being arranged so as to form arrays each of which extends in a scan direction of the substrate, and which are disposed so as to have a tilt relative to the scan direction of the substrate.

5. A multi-apertured electrode for an ion doping apparatus, comprising:
a large number of electrode apertures which serve to draw out an ion beam of rectangular shape, as a whole;
a plurality of electrode apertures constituting at least one electrode aperture group, and being individually arranged with positional shifts in a direction of one pair of parallel latera of the rectangular shape.

6. The multi-apertured electrode for an ion doping apparatus as defined in claim 5, wherein said large number of electrode apertures are sorted into a plurality of electrode aperture groups in accordance with their densities of beams.

7. The multi-apertured electrode for an ion doping apparatus as defined in either of claim 5 or 6, wherein the electrode apertures constituting said each electrode aperture group are arranged so as to form arrays in a direction of the other pair of parallel latera of the rectangular shape, and the arrays of the electrode apertures are disposed so as to have a tilt relative to the direction of the other pair of parallel latera of the rectangular shape.

8. A multi-apertured electrode for an ion doping apparatus, comprising:
a large number of electrode apertures which serve to draw out an ion beam of rectangular shape, as a whole;
said large number of electrode apertures being disposed so as to have a tilt relative to a direction of one pair of parallel latera of the rectangular shape.

* * * * *